United States Patent

Nakamura

[11] Patent Number: 5,933,736
[45] Date of Patent: Aug. 3, 1999

[54] METHOD OF MANUFACTURING A SEMICONDUCTOR DEVICE

[75] Inventor: Mitsuyoshi Nakamura, Tokyo, Japan

[73] Assignee: Mitsubishi Denki Kabushiki Kaisha, Tokyo, Japan

[21] Appl. No.: 09/030,125

[22] Filed: Feb. 25, 1998

Related U.S. Application Data

[62] Division of application No. 08/648,756, May 16, 1996, Pat. No. 5,757,047.

[30]   Foreign Application Priority Data

Dec. 14, 1995  [JP]  Japan .................................. 7-325780

[51] Int. Cl.$^6$ .................................................. H01L 21/336
[52] U.S. Cl. ........................... 438/283; 438/279; 438/284; 438/289; 438/291
[58] Field of Search ..................................... 438/279, 283, 438/284, 282, 289, 291

[56]         References Cited

U.S. PATENT DOCUMENTS 5,376,559  12/1994  Mukai et al. ........................... 438/283

FOREIGN PATENT DOCUMENTS 61-139056  12/1984  Japan .
63-102264   5/1988  Japan .
 3-19285   1/1991  Japan .

*Primary Examiner*—Trung Dang
*Attorney, Agent, or Firm*—Oblon, Spivak, McClelland, Maier & Neustadt, P.C.

[57]         ABSTRACT

A semiconductor device having the high integration and great driving ability is provided. An upper gate oxide film is formed on a gate electrode. An upper drain region is formed on a lower drain region through an oxide film, and an upper source region is formed on a lower source region through the oxide film. A polysilicon region is formed on the upper gate oxide film provided between the upper drain region and the upper source region. The lower layer portion of the polysilicon region is defined as a channel region.

8 Claims, 12 Drawing Sheets

METHOD OF MANUFACTURING A SEMICONDUCTOR DEVICE

This application is a division of application Ser. No. 08/648,756, filed on May 16, 1996 now U.S. Pat. No. 5,757,047.

BACKGROUND OF THE INVENTION

1. Field of the Invention

The present invention relates to the structure of a semiconductor device such as a MOS device, and a method for manufacturing the same.

2. Description of the Background Art

The structure, in particular, the gate dimension of a MOS device which is a semiconductor device having a MOS transistor has been reduced in order to get higher speed and greater driving ability. However, as the gate dimension is reduced more, wiring delay is increased due to the parasitic effects of a wiring (such as a wiring capacity or the like). For this reason, it has been desired that the driving ability of the device can be enhanced more.

FIG. 25 is a sectional view showing the structure of a MOS device according to the prior art. As an example, an N type MOS transistor will be described below. In FIG. 25, 1 designates a silicon substrate, 1A designates a P type well region formed on the upper layer portion of the silicon substrate 1, 2 designates a thick oxide film for isolation between elements (hereinafter referred to as a field oxide film), 3 designates a channel region, 4 designates a gate oxide film formed on the channel region 3, 5C designates a gate electrode formed on the gate oxide film 4, 6C designates an N type drain region which includes N type impurities, and 7C designates an N type source region which includes the N type impurities. The drain region 6C and the source region 7C are formed with the channel region 3 held therebetween.

In FIG. 25, 8 designates a layer insulating film formed on the overall surface, 9 designates a contact hole for connection of a wiring layer to the drain or source region which is selectively formed on the layer insulating film 8, 10 designates an aluminum wiring layer which fills the contact hole 9, and 11 designates a passivation film for device surface protection which covers the layer insulating film 8 and the aluminum wiring layer 10.

FIG. 26 is a plan view showing the structure of the MOS device according to the prior art. For convenience of explanation, the layer insulating film 8 and the passivation film 11 shown in FIG. 25 are omitted. L designates a gate length and W4 designates a gate width of a source-drain region. FIG. 25 shows a D—D section of FIG. 26. In FIG. 26, a wiring layer 50 is electrically connected to the gate electrode 5C through a contact hole 51 formed on the gate electrode 5C.

The MOS device according to the prior art has the structures shown in FIGS. 25 and 26. The gate length L has been reduced in order to enhance the driving ability. However, the reduction of the gate length L has limitations in respect of the source-drain pressure resistance if the well concentrations are the same.

For this reason, the increase in the gate width W is the only way to enhance the current driving ability still more. However, when the gate width W is made greater, the size (chip size) of the semiconductor device is increased so that integration is deteriorated. Consequently, reduction cannot be obtained.

SUMMARY OF THE INVENTION

A first aspect of the present invention is directed to a semiconductor device comprising a semiconductor substrate of a first conductivity type, first and second semiconductor regions of a second conductivity type which are selectively formed on the surface of the semiconductor substrate respectively, the surface of the semiconductor substrate positioned between the first and second semiconductor regions being defined as a first channel region, a first gate insulating film formed on the first channel region, a gate electrode formed on the first gate insulating film, a second gate insulating film formed on the gate electrode, a third semiconductor region of the second conductivity type formed above the first semiconductor region and electrically connected to the first semiconductor region, a fourth semiconductor region of the second conductivity type formed above the second semiconductor region and electrically connected to the second semiconductor region, and a fifth semiconductor region of the first conductivity type formed on the second gate insulating film, the fifth semiconductor region being formed adjacently to the third and fourth semiconductor regions between the third and fourth semiconductor regions, and the lower layer portion of the fifth semiconductor region being defined as a second channel region.

A second aspect of the present invention is directed to the semiconductor device wherein the first semiconductor region has first and second partial semiconductor regions and the third semiconductor region is formed on the first partial semiconductor region of the first semiconductor region through an insulating film, and wherein the second semiconductor region has third and fourth partial semiconductor regions, and the fourth semiconductor region is formed on the third partial semiconductor region of the second semiconductor region through an insulating film, the semiconductor device further comprising a first wiring layer formed from the second partial semiconductor region of the first semiconductor region to the third semiconductor region, and a second wiring layer formed from the fourth partial semiconductor region of the second semiconductor region to the fourth semiconductor region.

A third aspect of the present invention is directed to the semiconductor device wherein the third semiconductor region is directly formed on at least a part of the first semiconductor region, and wherein the fourth semiconductor region is directly formed on at least a part of the second semiconductor region, the semiconductor device further comprising a first wiring layer formed on the third semiconductor region, and a second wiring layer formed on the fourth semiconductor region.

A fourth aspect of the present invention is directed to a method for manufacturing a semiconductor device comprising the steps of (a) preparing a semiconductor substrate of a first conductivity type, (b) forming a first insulating film on the semiconductor substrate, (c) forming a gate electrode on a predetermined gate electrode formation region on the first insulating film, the first insulating film positioned below the predetermined gate electrode formation region being defined as a first gate insulating film, and the surface of the semiconductor substrate positioned below the predetermined gate electrode formation region being defined as a first channel region, (d) selectively forming first and second semiconductor regions of a second conductivity type on the surface of the semiconductor substrate respectively, the first and second semiconductor regions being formed to hold the first channel region therebetween, the first semiconductor region having first and second partial semiconductor regions, and the second semiconductor region having third and fourth partial semiconductor regions, (e) forming a second gate insulating film on the gate electrode, (f) forming a semiconductor layer on the first insulating film and the second gate insulating film, the lower layer portion of the semiconductor layer positioned on the second gate insulating film being defined as a second channel region, (g) forming a third semiconductor region of the second conductivity type on the semiconductor layer adjacently to the second channel region above the first partial semiconductor region of the first semiconductor region, (h) forming a fourth semiconductor region of the second conductivity type on the semiconductor layer adjacently to the second channel region above the third partial semiconductor region of the second semiconductor region, (i) forming a first wiring layer from the second partial semiconductor region of the first semiconductor region to the third semiconductor region, and (j) forming a second wiring layer from the fourth partial semiconductor region of the second semiconductor region to the fourth semiconductor region.

A fifth aspect of the present invention is directed to a method for manufacturing a semiconductor device comprising the steps of (a) preparing a semiconductor substrate of a first conductivity type, (b) forming a first gate insulating film on the semiconductor substrate, the surface of the semiconductor substrate which is positioned under the gate insulating film being defined as a first channel region, (c) forming a gate electrode on the first gate insulating film, (d) selectively forming first and second semiconductor regions of a second conductivity type on the surface of the semiconductor substrate respectively, the first and second semiconductor regions being formed to hold the first channel region therebetween, (e) forming a second gate insulating film on the gate electrode, (f) forming a semiconductor layer on the first and second semiconductor regions and the second gate insulating film, the semiconductor layer being directly formed on at least a part of the first and second semiconductor regions, and the lower layer portion of the semiconductor layer which is positioned on the second gate insulating film being defined as a second channel region, (g) forming third and fourth semiconductor regions of the second conductivity type on the lower layer portion of the semiconductor layer which directly adjoins the first and second semiconductor regions respectively, the third and fourth semiconductor regions being formed to hold the second channel region therebetween, (h) forming a first wiring layer on the third semiconductor region, and (i) forming a second wiring layer on the fourth semiconductor region.

According to the first aspect of the present invention, the semiconductor device operates equivalently to a transistor comprised of a first partial transistor which includes the first semiconductor region, the second semiconductor region, the first gate insulating film and the gate electrode, and a second partial transistor which includes the third semiconductor region, the fourth semiconductor region, the second gate insulating film and the gate electrode.

The third and fourth semiconductor regions are formed above the first and second semiconductor regions respectively. Consequently, the integration of the semiconductor device is not deteriorated.

According to the first aspect of the present invention, the semiconductor device can show, with integration for first partial transistor formation, the driving ability which is obtained by adding the driving ability of the first partial transistor to that of the second partial transistor.

Accordingly, the semiconductor device according to the first aspect of the present invention has great driving ability with high integration.

According to the second aspect of the present invention, the first wiring layer is formed to electrically connect the first semiconductor region to the third semiconductor region, and the second wiring layer is formed to electrically connect the second semiconductor region to the fourth semiconductor region.

According to the third aspect of the present invention, the third semiconductor region is directly formed on at least a part of the first semiconductor region to electrically connect the first semiconductor region to the third semiconductor region, and the fourth semiconductor region is directly formed on at least a part of the second semiconductor region to electrically connect the second semiconductor region to the fourth semiconductor region.

According to the fourth aspect of the present invention, the method for manufacturing a semiconductor device comprises the steps of (g) and (h) forming the third and fourth semiconductor regions above the first and second semiconductor regions respectively, (i) forming the first wiring layer from the second partial semiconductor region of the first semiconductor region to the third semiconductor region so as to electrically connect the first semiconductor region to the third semiconductor region, and (j) forming the second wiring layer from the fourth partial semiconductor region of the second semiconductor region to the fourth semiconductor region so as to electrically connect the second semiconductor region to the fourth semiconductor region.

Accordingly, the semiconductor device manufactured by the method according to the fourth aspect of the present invention operates equivalently to a transistor comprised of a first partial transistor which includes the first semiconductor region, the second semiconductor region, the first gate insulating film and the gate electrode, and a second partial transistor which includes the third semiconductor region, the fourth semiconductor region, the second gate insulating film and the gate electrode. The third and fourth semiconductor regions are formed above the first and second semiconductor regions respectively. Consequently, the integration of the semiconductor device is not deteriorated.

Consequently, the semiconductor device manufactured by the method according to the fourth aspect of the present invention can show, with integration for first partial transistor formation, the driving ability which is obtained by adding the driving ability of the first partial transistor to that of the second partial transistor.

The method for manufacturing a semiconductor device according to the fifth aspect of the present invention comprises the steps of (f) forming the semiconductor layer on the first and second semiconductor regions and the second gate insulating film, and (g) forming the third and fourth semiconductor regions of the second conductivity type on the lower layer portion of the semiconductor layer which directly adjoins the first and second semiconductor regions respectively so as to electrically connect the first semiconductor region to the third semiconductor region and to electrically connect the second semiconductor region to the fourth semiconductor region.

Accordingly, the semiconductor device manufactured by the method according to the fifth aspect of the present invention operates equivalently to a transistor comprised of a first partial transistor which includes the first semiconductor region, the second semiconductor region, the first gate insulating film and the gate electrode, and a second partial transistor which includes the third semiconductor region, the fourth semiconductor region, the second gate insulating film and the gate electrode. The third and fourth semiconductor regions are formed above the first and second semiconductor regions respectively. Consequently, the integration of the semiconductor device is not deteriorated.

Consequently, the semiconductor device manufactured by the method according to the fifth aspect of the present invention can show, with integration for first partial transistor formation, the driving ability which is obtained by adding the driving ability of the first partial transistor to that of the second partial transistor.

In addition, the semiconductor layer is directly formed on the first and second semiconductor regions. Consequently, the semiconductor layer can be formed by the epitaxial growth method with crystalline orientation of at least one of the first and second semiconductor regions.

As a result, the semiconductor layer can be formed with good crystalline properties. Consequently, the third and fourth semiconductor regions have good crystalline properties so that the performance of the second partial transistor can be enhanced. Thus, in the semiconductor device manufactured by the method according to the fifth aspect of the present invention, the driving ability can be enhanced and a current can be inhibited from leaking out.

In order to solve the above problems, it is an object of the present invention to provide a semiconductor device having the great driving ability with high integration.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
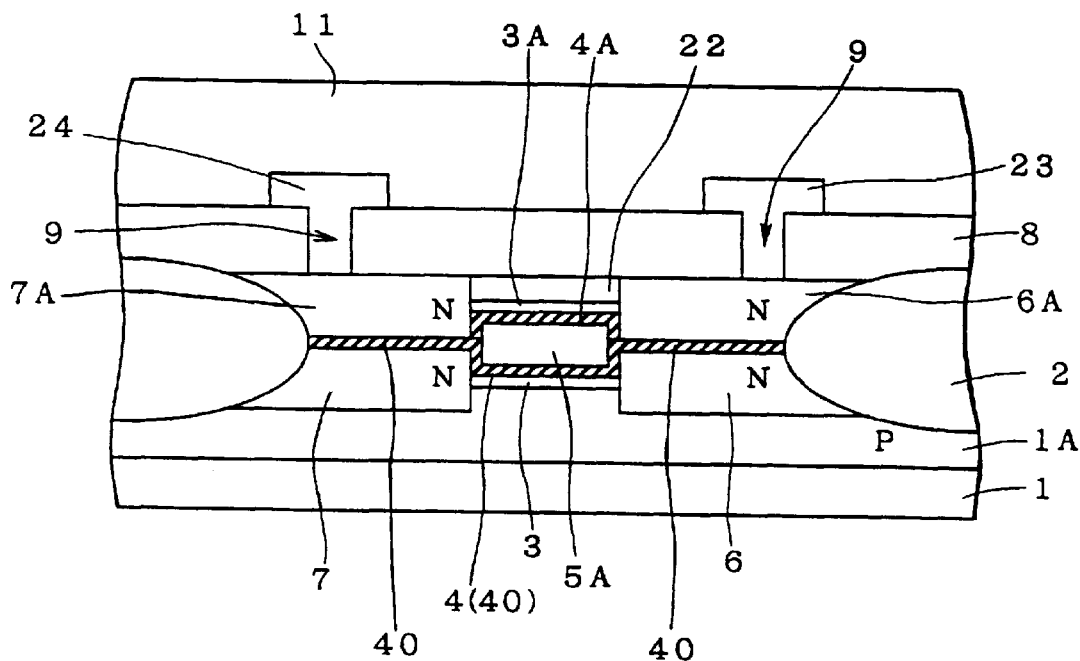
FIG. 1 is a sectional view showing the structure of a semiconductor device (MOS device) according to a first embodiment of the present invention.

FIG. 1 is a sectional view showing the structure of a MOS device (a semiconductor device having a MOS transistor) according to a first embodiment of the present invention. As shown in FIG. 1, an N type MOS transistor is formed. A P type well region 1A is formed on the upper layer portion of a silicon substrate 1. An N type lower drain region 6 and an N type lower source region 7 are selectively formed on the surface of the P type well region 1A. The surface of the P type well region 1A which is formed like a concave between the lower drain region 6 and the lower source region 7 is defined as a channel region 3.

An oxide film 40 is formed on the lower drain region 6, the lower source region 7 and the channel region 3. The oxide film 40 positioned on the channel region 3 is defined as a lower gate oxide film 4. A gate electrode 5A is formed on the lower gate oxide film 4. The gate electrode 5A protrudes from the lower drain region 6 and the lower source region 7. An upper gate oxide film 4A is formed on the gate electrode 5A.

An upper drain region 6A is formed on the lower drain region 6 through the oxide film 40. An upper source region 7A is formed on the lower source region 7 through the oxide film 40. A polysilicon region 22 is formed on the upper gate oxide film 4A provided between the upper drain region 6A and the upper source region 7A. The surface of the polysilicon region 22 is formed on a level with the surfaces of the upper drain region 6A and upper source region 7A. The lower layer portion of the polysilicon region 22 is defined as a channel region 3A.

A field oxide film 2 for isolation between elements is formed on the sides of the lower drain region 6 and upper drain region 6A and those of the lower source region 7 and upper source region 7A. A layer insulating film 8 is formed to cover the upper drain region 6A, the upper source region 7A, the polysilicon region 22 and the field oxide film 2.

A contact hole 9 is provided on the layer insulating film 8 which is formed on the upper drain region 6A and the upper source region 7A. An aluminum wiring layer 23 is formed to fill the contact hole 9 on the upper drain region 6A, and an aluminum wiring layer 24 is formed to fill the contact hole 9 on the upper source region 7A. A passivation film 11 is formed on the overall surface.

Figure 2:
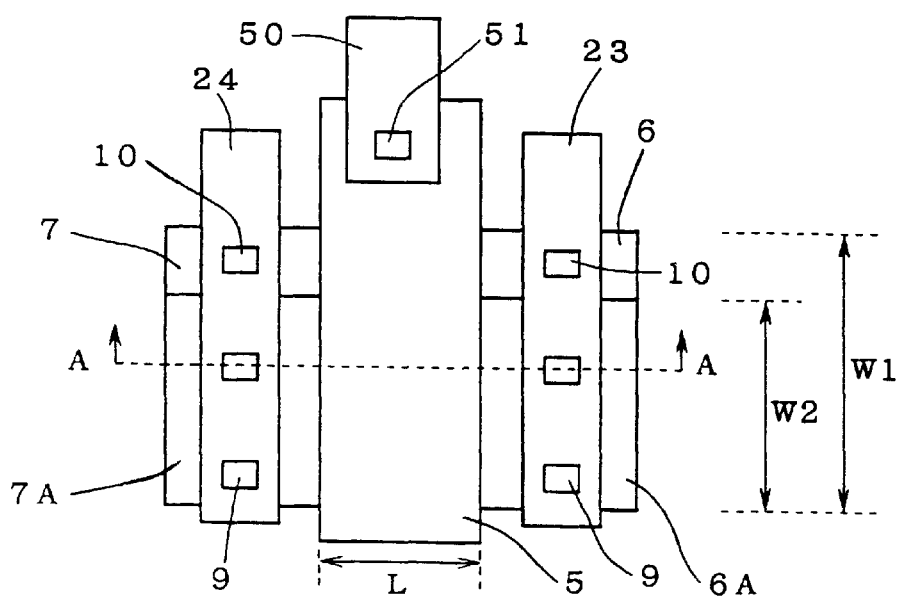
FIG. 2 is a plan view showing the planar structure of the semiconductor device according to the first embodiment.

FIG. 2 is a plan view showing the planar structure of the MOS device shown in FIG. 1. For convenience of explanation, the layer insulating film 8 and the passivation film 11 of FIG. 1 are not shown in FIG. 2. L designates a gate length, W1 designates a gate width of the lower drain and source regions 6 and 7, and W2 designates a gate width of the upper drain and source regions 6A and 7A. FIG. 1 shows an A—A section of FIG. 2.

As shown in FIGS. 1 and 2, the upper drain region 6A is formed, through the oxide film 40, on a first part of the lower drain region 6 which is comparatively large, and is not formed on a second part of the lower drain region 6 which is comparatively small. Similarly, the upper source region 7A is formed, through the oxide film 40, on a first part of the lower source region 7 which is comparatively large, and is not formed on a second part of the lower source region 7 which is comparatively small.

The aluminum wiring layer 23 is formed to fill the contact hole 9 on the upper drain region 6A, and to fill a contact hole 10 on the second part of the lower drain region 6. Thus, the aluminum wiring layer 23 is formed from the lower drain region 6 to the upper drain region 6A so that the lower drain region 6 is electrically connected to the upper drain region 6A.

The aluminum wiring layer 24 is formed to fill the contact hole 9 on the upper source region 7A, and to fill the contact hole 10 on the second part of the lower source region 7. Thus, the aluminum wiring layer 24 is formed from the lower source region 7 to the upper source region 7A so that the lower source region 7 is electrically connected to the upper source region 7A.

The MOS device having the above structure according to the first embodiment operates equivalently to a transistor comprised of a first partial transistor which includes the lower drain region 6, the lower source region 7, the lower gate oxide film 4 and the gate electrode 5A, and a second partial transistor which includes the upper drain region 6A, the upper source region 7A, the upper gate oxide film 4A and the gate electrode 5A.

Figure 25:
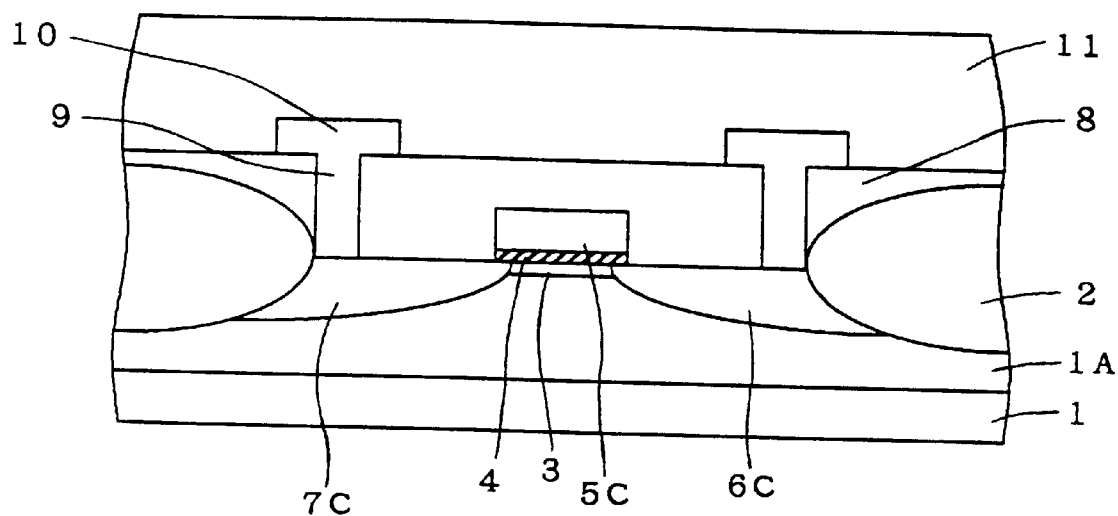
FIG. 25 is a sectional view showing the structure of a semiconductor device according to the prior art.
Figure 26:
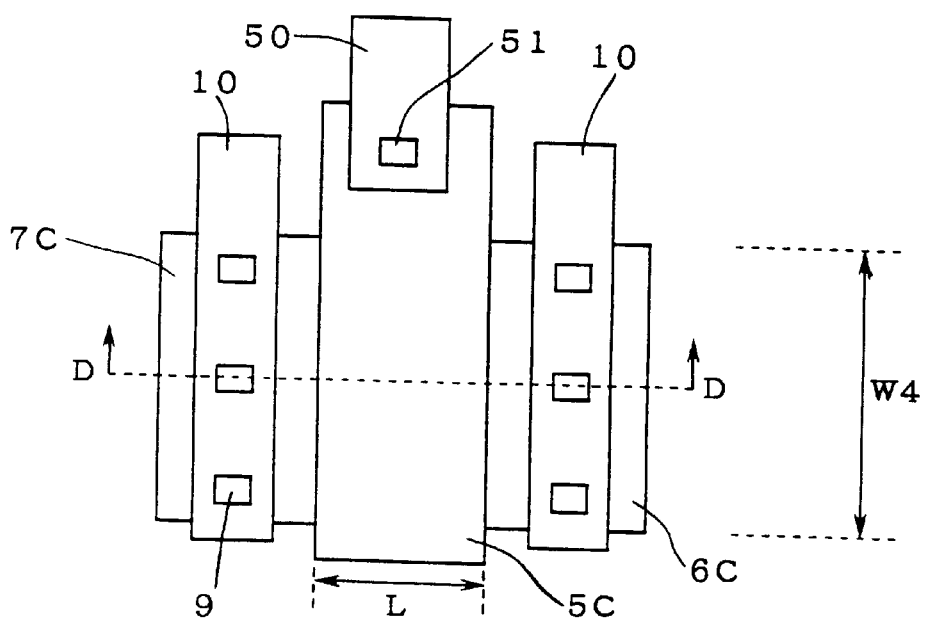
FIG. 26 is a plan view showing the planar structure of the semiconductor device according to the prior art.

Accordingly, the real gate width W of the MOS device according to the first embodiment is expressed by W=W1+W2. The lower gate width W1 can be kept almost equal to the gate width W4 of the MOS device according to the prior art shown in FIGS. 25 and 26. The gate length L is the same as that of the structure according to the prior art. Consequently, the gate width W is greater, by the upper gate width W2, than that of the structure according to the prior art. Accordingly, the current flow between a source and a drain is increased so that the current driving ability is greatly enhanced.

The upper drain region 6A and the upper source region 7A are formed above the lower drain region 6 and the lower source region 7 respectively. Consequently, the upper gate width W2 does not cause the integration of the MOS device to be deteriorated.

More specifically, the MOS device according to the first embodiment can show, with integration for first partial transistor formation, the current driving ability which is obtained by adding the current driving ability of the first partial transistor to that of the second partial transistor.

Accordingly, the MOS device according to the first embodiment has the great driving ability with high integration.

Figure 3:
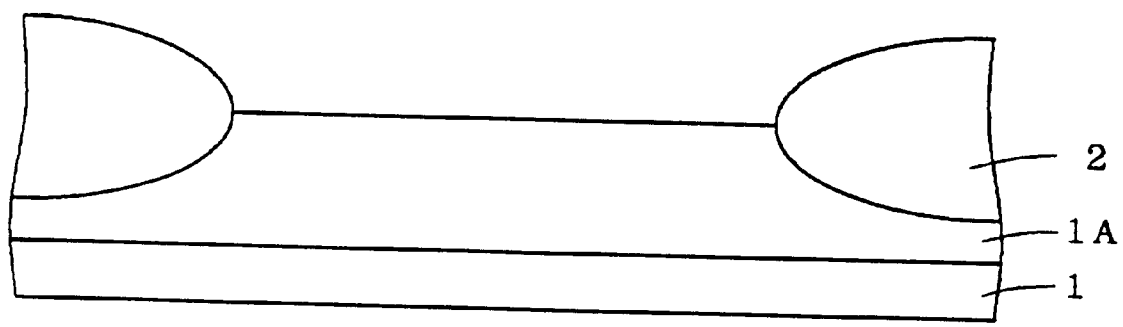
FIG. 3 is a sectional view showing a method for manufacturing the semiconductor device according to the first embodiment.

FIGS. 3 to 19 are sectional views showing a method for manufacturing the MOS device according to the first embodiment. The method for manufacturing the MOS device will be described below with reference to FIGS. 3 to 19. In the following description, known values are employed in ion implantation conditions, film forming diffusion conditions and the like which have no numeric values, and only the main part of the present invention has numeric values (wafer process parameter). As shown in FIG. 3, ions are implanted into the upper layer portion of a silicon substrate 1 and thermal diffusion is performed to form a P type well region 1A. Then, a field oxide film 2 for isolation is formed by the known selective oxidation method.

Figure 4:
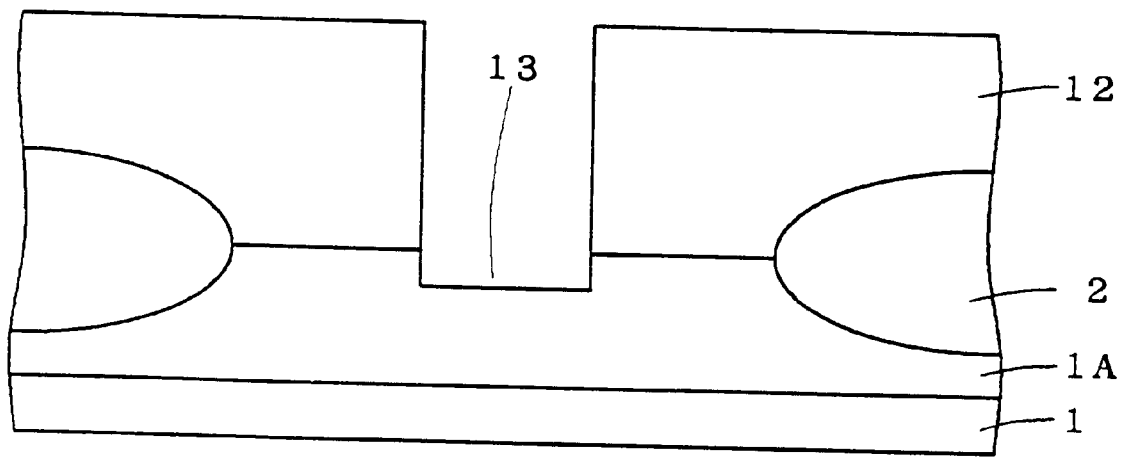
FIG. 4 is a sectional view showing the method for manufacturing the semiconductor device according to the first embodiment.

As shown in FIG. 4, a resist pattern 12 for selective removal is formed. The resist pattern 12 acts as a mask so that silicon etching is performed on the surface of the P type well region 1A. Consequently, a gate electrode formation region 13 is formed.

Figure 5:
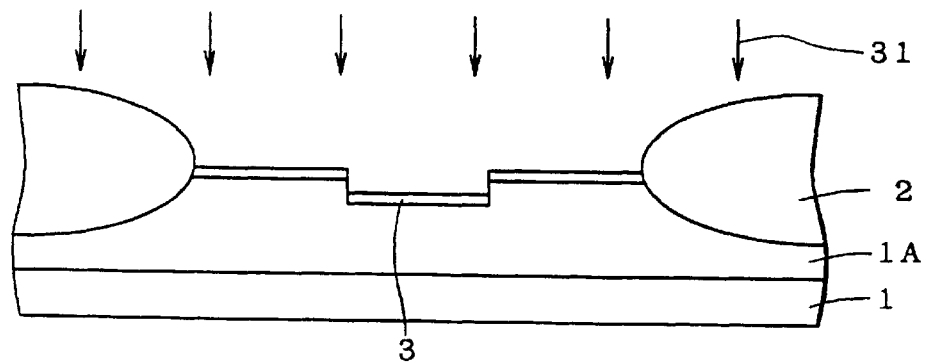
FIG. 5 is a sectional view showing the method for manufacturing the semiconductor device according to the first embodiment.

As shown in FIG. 5, channel doping for determining a threshold voltage Vth of an NMOS transistor is performed by ion implantation. More specifically, P type impurity ions 31 are implanted so that a channel region 3 is formed on the gate electrode formation region 13 of the P type well region 1A.

Figure 6:
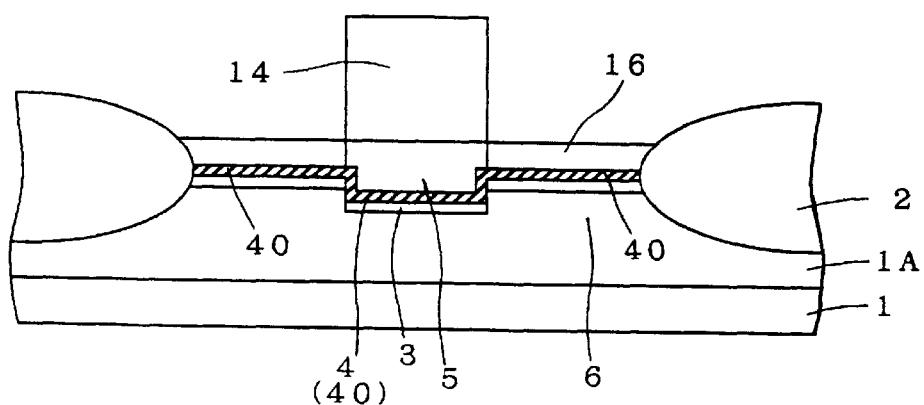
FIG. 6 is a sectional view showing the method for manufacturing the semiconductor device according to the first embodiment.

As shown in FIG. 6, an oxide film 40 is formed on the overall surface by the thermal oxidation method. A polysilicon film 5 for forming a gate electrode is provided by the CVD method. Then, a photoresist pattern 14 for selective removal is formed.

Figure 7:
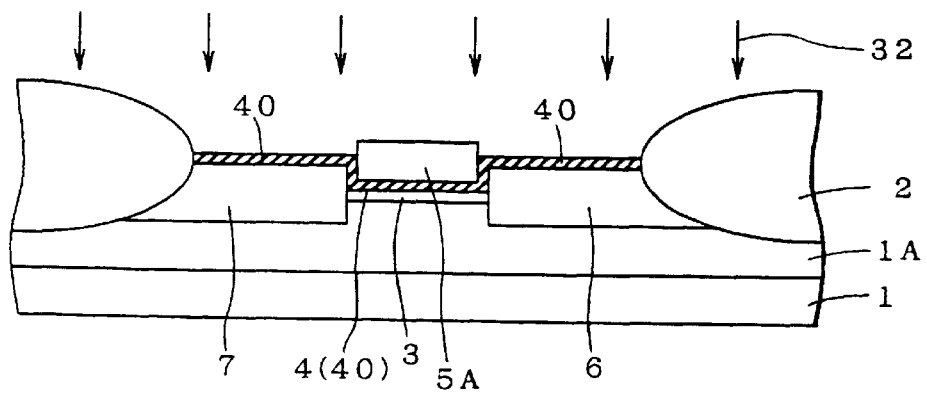
FIG. 7 is a sectional view showing the method for manufacturing the semiconductor device according to the first embodiment.
Figure 9:
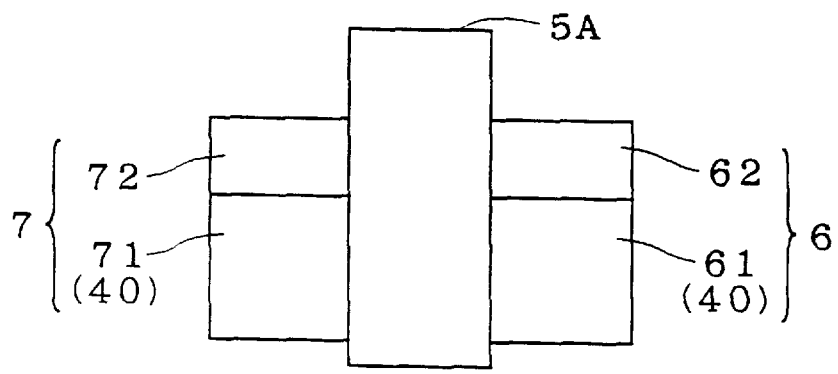
FIG. 9 is a sectional view showing the method for manufacturing the semiconductor device according to the first embodiment.

The photoresist pattern 14 acts as a mask so that the polysilicon film 5 is selectively removed. Thus, a gate electrode 5A is formed as shown in FIG. 7. The oxide film 40 provided under the gate electrode 5A is defined as a lower gate oxide film 4. Then, the gate electrode 5A acts as a mask so that N type impurity ions 32 are implanted to perform heat-treatment. Consequently, a lower drain region 6 and a lower source region 7 are formed. Accordingly, the lower drain region 6 and the lower source region 7 are formed adjacently to the channel region 3 to be held therebetween. As shown in FIG. 9, the lower drain region 6 has a partial drain region 61 which is comparatively large and a partial drain region 62 which is comparatively small. The lower source region 7 has a partial source region 71 which is comparatively large and a partial source region 72 which is comparatively small.

Figure 8:
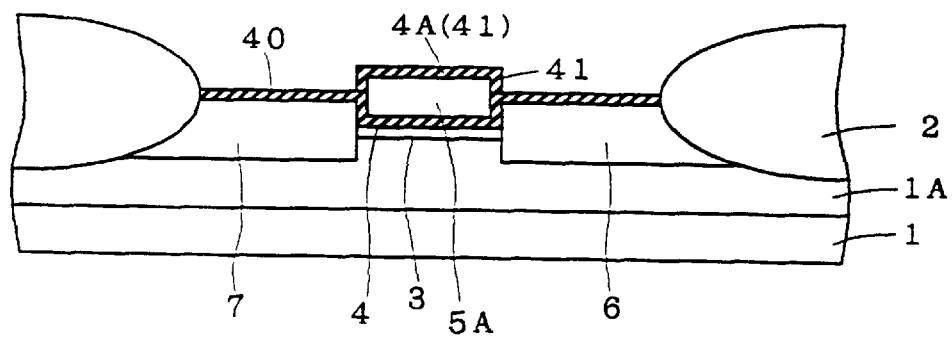
FIG. 8 is a sectional view showing the method for manufacturing the semiconductor device according to the first embodiment.

As shown in FIG. 8, an oxide film 41 is then formed so as to cover the gate electrode 5A by the CVD method or the thermal oxidation method. In this case, the oxide film 41 provided on the polysilicon film 5 is defined as an upper gate oxide film 4A.

Figure 10:
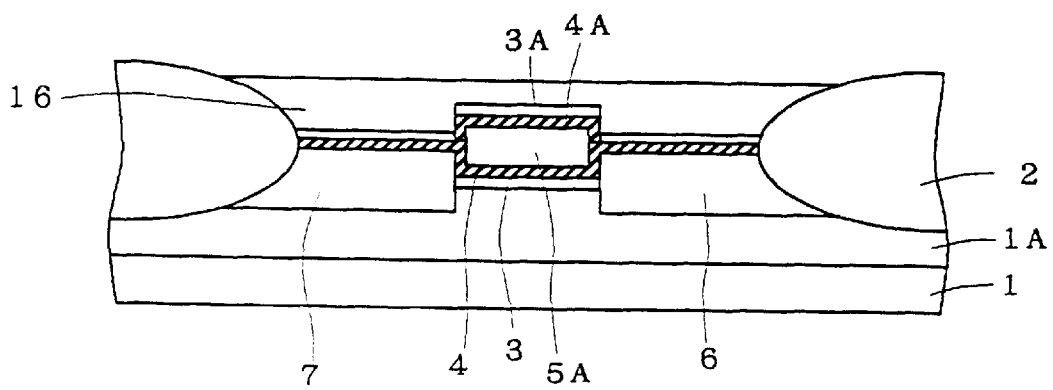
FIG. 10 is a sectional view showing the method for manufacturing the semiconductor device according to the first embodiment.

As shown in FIG. 10, a polysilicon layer is formed at a thickness of about 1 µm by the CVD method, and smoothed by the etchback method so that a polysilicon layer 16 is formed at a thickness of about 0.5 µm. Then, P type impurity ions are implanted in order of ~$10^{13}$/cm$^2$ at an energy of 50 KeV or less so that channel doping for adjusting a threshold voltage Vth is performed. Consequently, an upper channel region 3A is formed on the lower layer portion of the polysilicon layer 16 which is positioned on the upper gate oxide film 4A.

Figure 11:
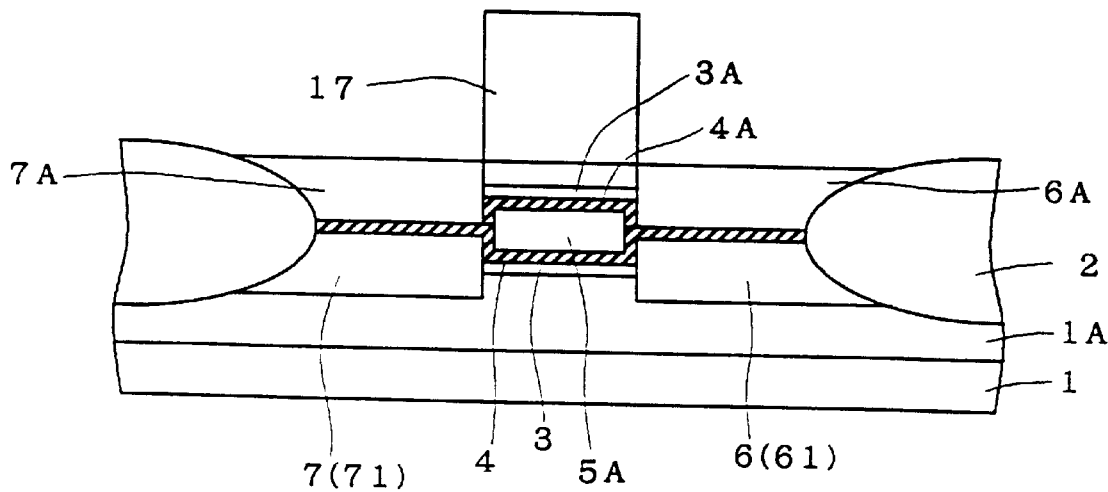
FIG. 11 is a sectional view showing the method for manufacturing the semiconductor device according to the first embodiment.

Then, a photoresist pattern 17 for forming upper source and drain regions is provided as shown in FIG. 11. The photoresist pattern 17 acts as a mask so that N type impurity ions are implanted into the polysilicon layer 16 in order of ~$10^{16}$/cm$^2$ at an energy of 100 Kev or less to perform heat-treatment. Thus, upper drain and source regions 6A and 7A are formed. The upper drain region 6A is formed above the partial drain region 61 of the lower drain region 6 through the oxide film 40. The upper source region 7A is formed above the lower source region 7 through the oxide film 40. The polysilicon layer 16 provided on the channel region 3A serves as the polysilicon region 22 shown in FIG. 1.

Figure 12:
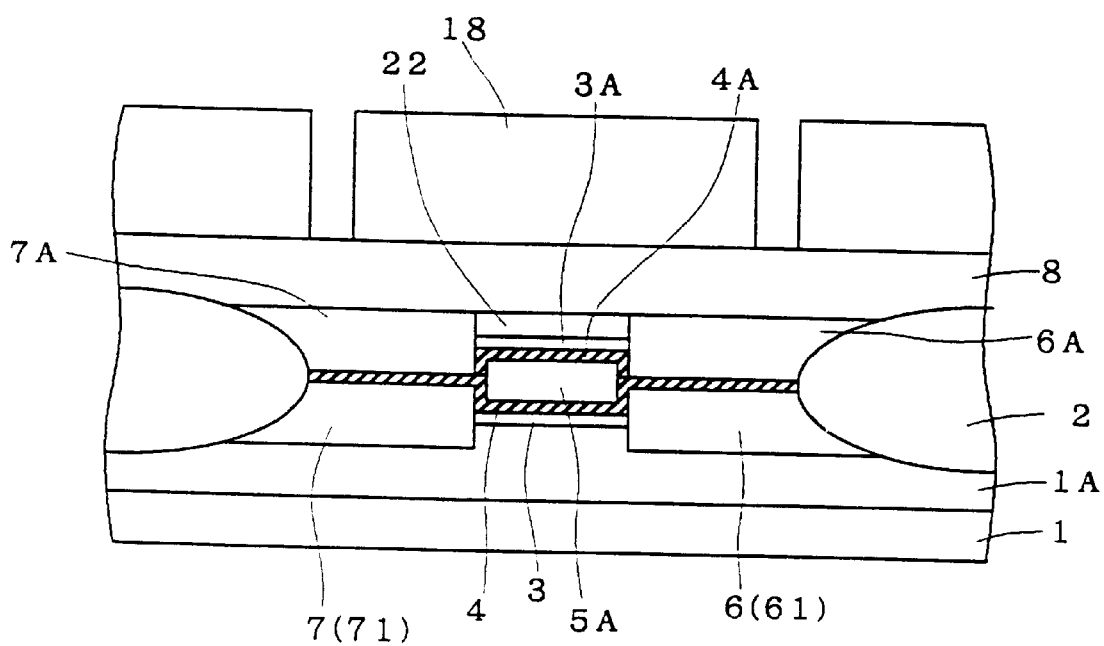
FIG. 12 is a sectional view showing the method for manufacturing the semiconductor device according to the first embodiment.
Figure 13:
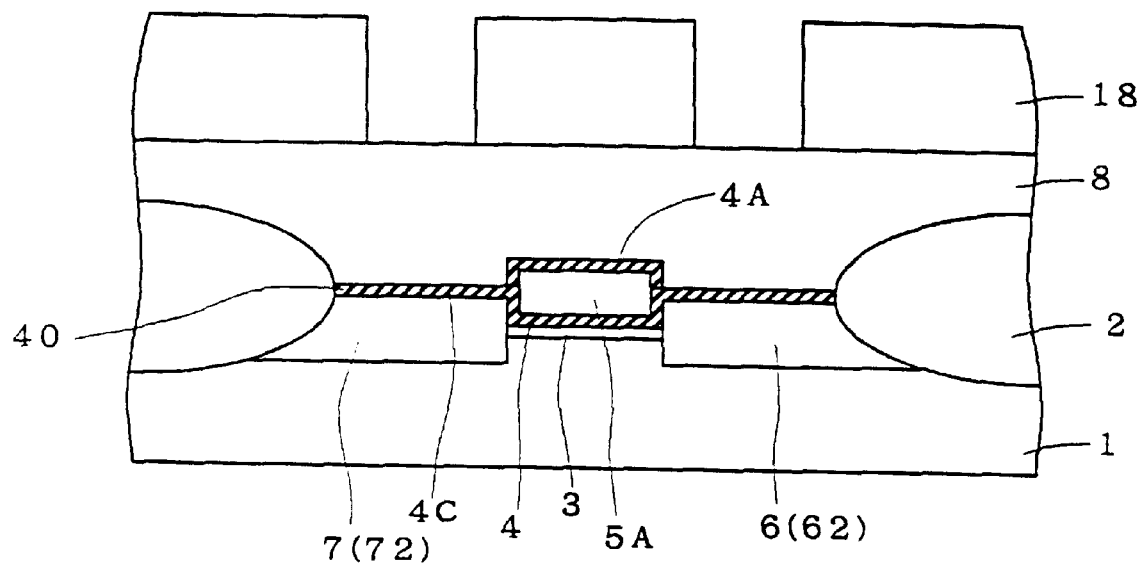
FIG. 13 is a sectional view showing the method for manufacturing the semiconductor device according to the first embodiment.
Figure 14:
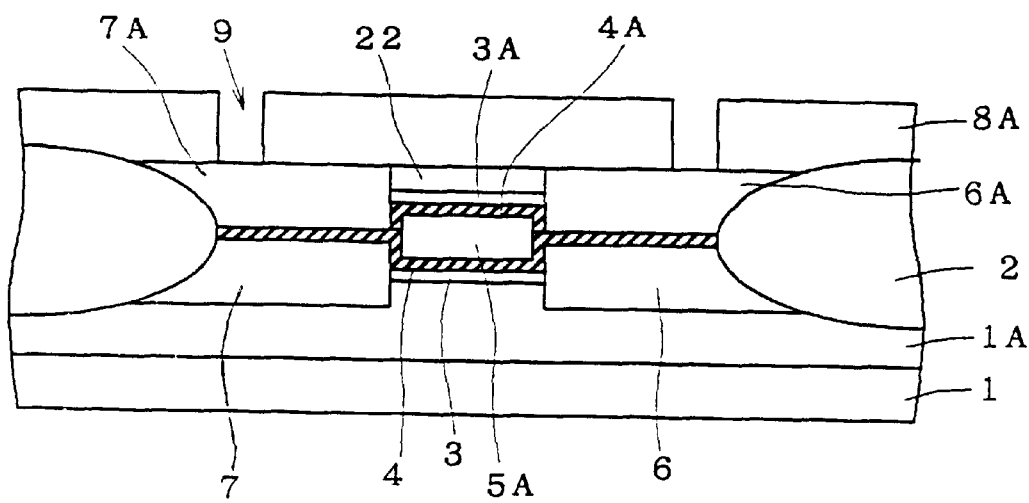
FIG. 14 is a sectional view showing the method for manufacturing the semiconductor device according to the first embodiment.
Figure 15:
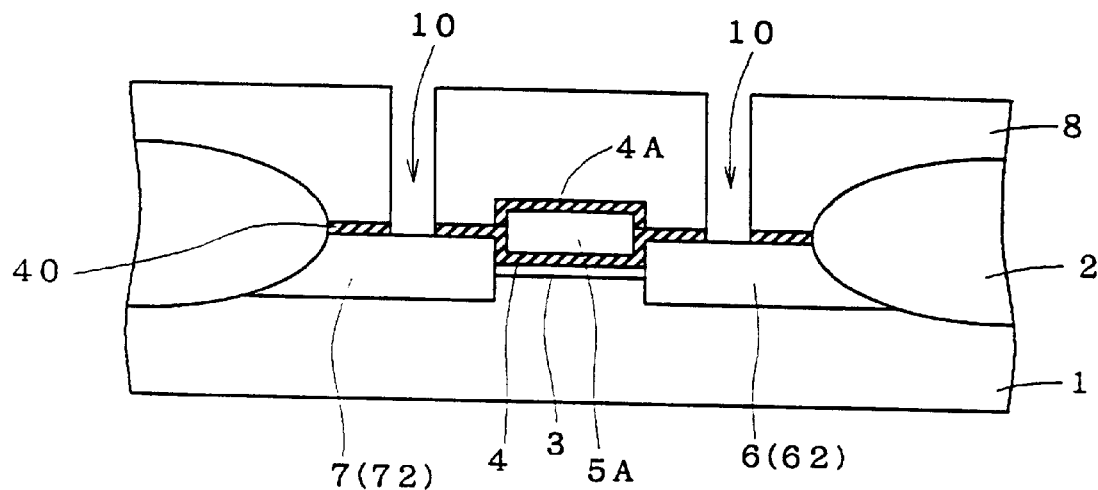
FIG. 15 is a sectional view showing the method for manufacturing the semiconductor device according to the first embodiment.

As shown in FIGS. 12 and 13, a layer insulating film 8 is formed on the overall surface by the CVD method, and a photoresist pattern 18 for selective removal is then formed. The photoresist pattern 18 acts as a mask so that etching is performed on the layer insulating film 8. As shown in FIG. 14, a contact hole 9 for connection of a wiring to the upper drain region 6A or the upper source region 7A is formed. As shown in FIG. 15, a contact hole 10 for connection of the wiring to the partial drain region 62 of the lower drain region 6 or the partial source region 72 of the lower source region 7 is formed.

Figure 16:
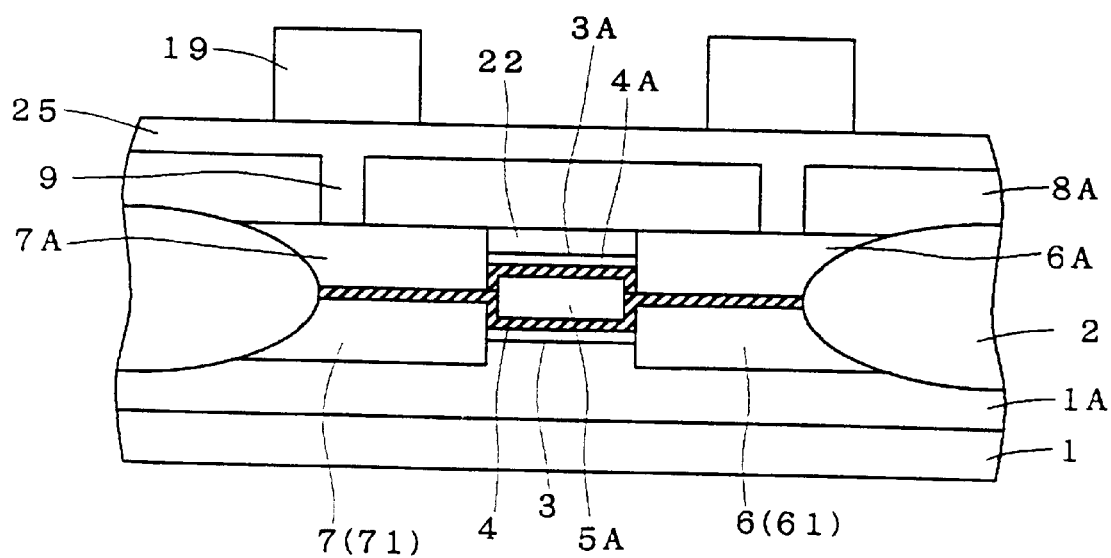
FIG. 16 is a sectional view showing the method for manufacturing the semiconductor device according to the first embodiment.
Figure 17:
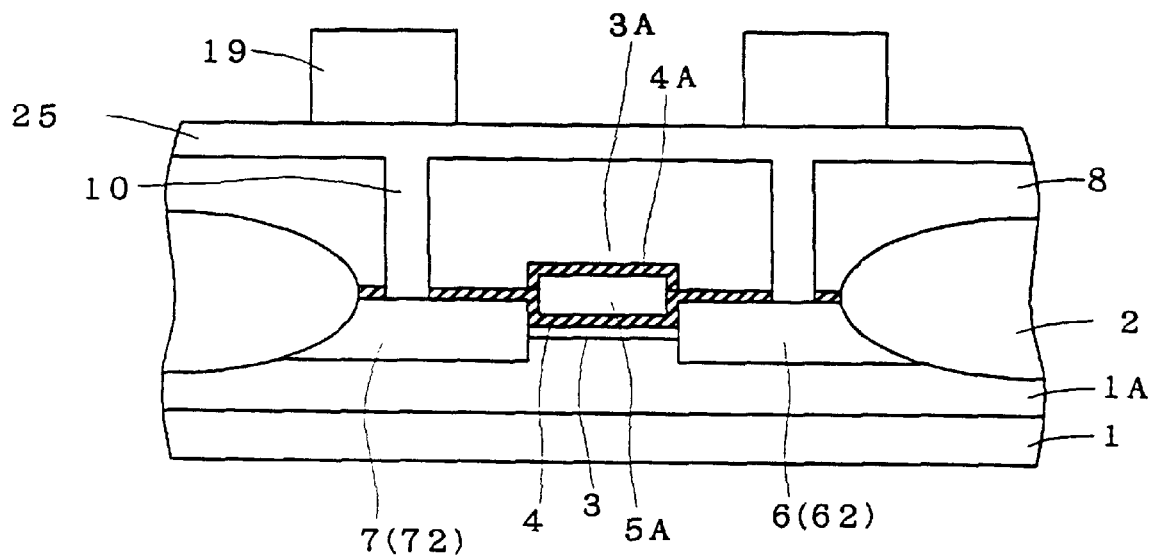
FIG. 17 is a sectional view showing the method for manufacturing the semiconductor device according to the first embodiment.

As shown in FIGS. 16 and 17, the contact holes 9 and 10 are filled with an aluminum layer 25 such as aluminum, aluminum silicon or an aluminum silicon copper film by sputtering, so that an aluminum wiring is formed on the overall surface. Then, a photoresist pattern 19 for selective removal is formed.

Figure 18:
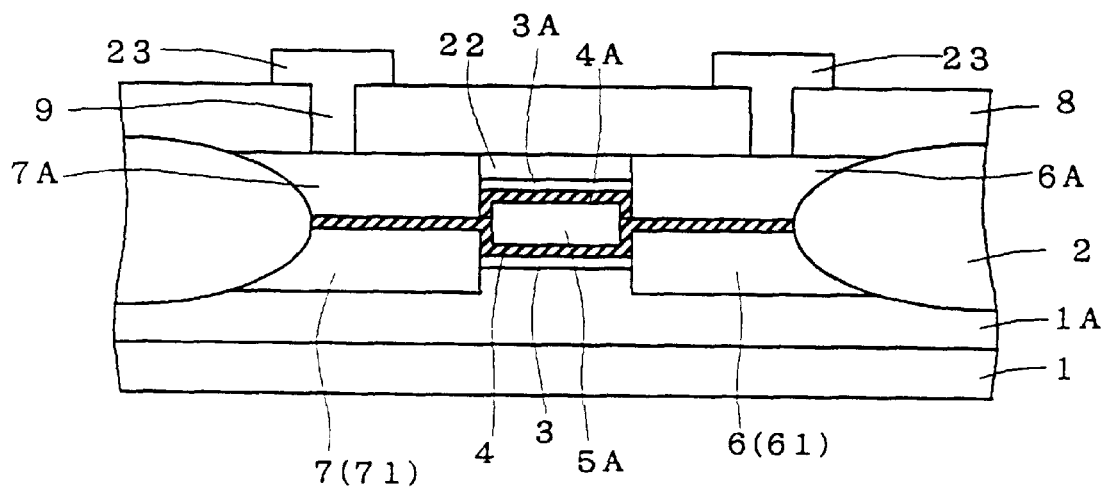
FIG. 18 is a sectional view showing the method for manufacturing the semiconductor device according to the first embodiment.
Figure 19:
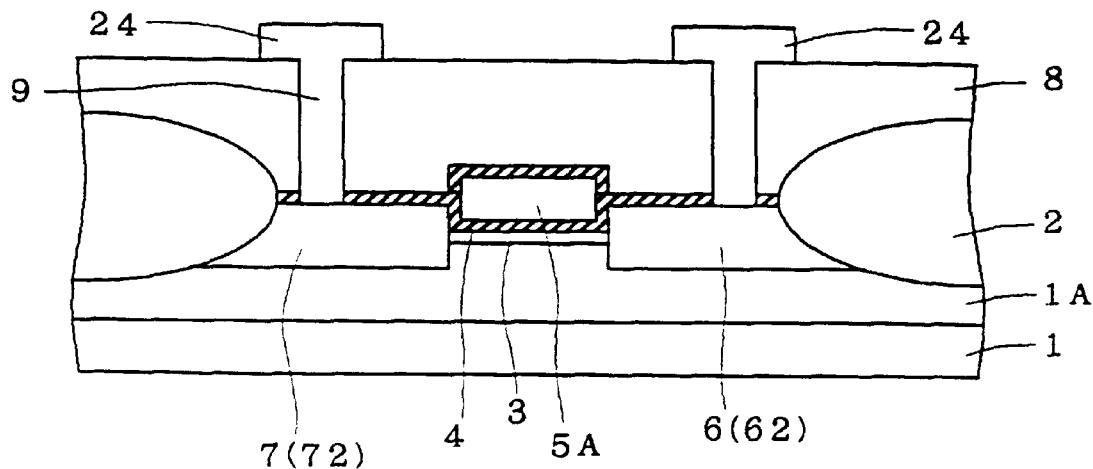
FIG. 19 is a sectional view showing the method for manufacturing the semiconductor device according to the first embodiment.

As shown in FIGS. 18 and 19, the photoresist pattern 19 acts as a mask so that the aluminum layer 25 is selectively removed. Thus, aluminum wiring layers 23 and 24 are formed. Then, a passivation film 11 for surface protection is formed. Consequently, the structures shown in FIGS. 1 and 2 are obtained.

The method for manufacturing the MOS device according to the first embodiment can be implemented without patterning the oxide film 40. Consequently, manufacturing steps can be simplified.

Second Embodiment

Figure 20:
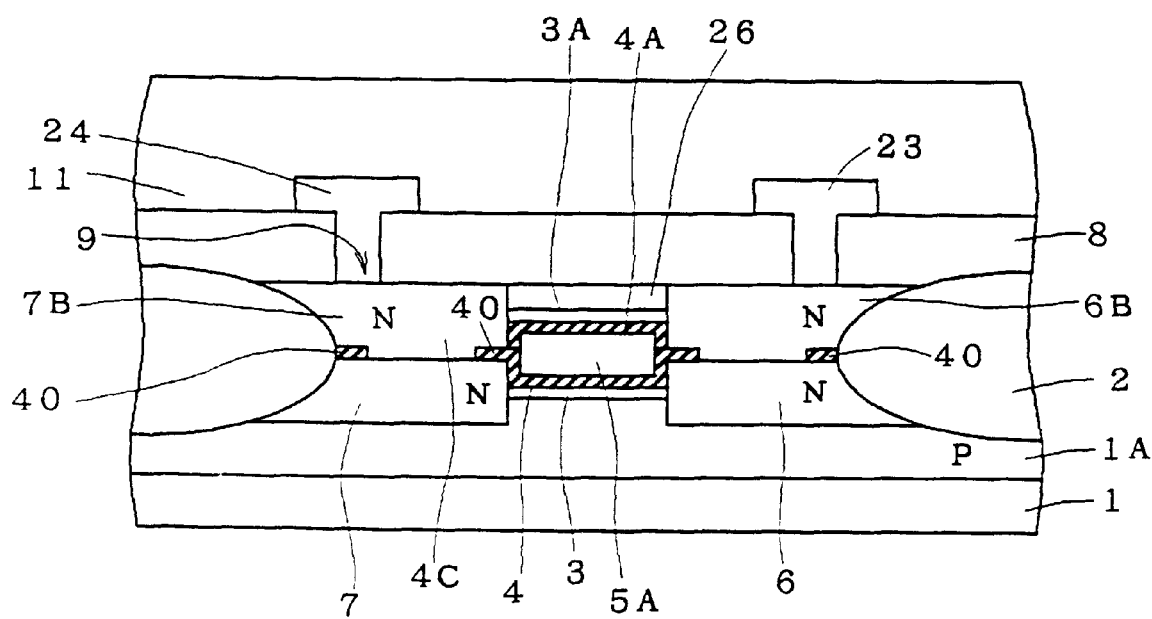
FIG. 20 is a sectional view showing the structure of a semiconductor device according to a second embodiment of the present invention.

FIG. 20 is a sectional view showing the structure of a MOS device according to a second embodiment of the present invention. As shown in FIG. 20, an N type MOS transistor is formed. A P type well region 1A is formed on the upper layer portion of a silicon substrate 1. An N type lower drain region 6 and an N type lower source region 7 are selectively formed on the surface of the P type well region 1A. The surface of the P type well region 1A which is formed like a concave between the lower drain region 6 and the lower source region 7 is defined as a channel region 3.

An oxide film 40 is formed on a part of the lower drain region 6, a part of the lower source region 7 and the channel region 3. The oxide film 40 positioned on the channel region 3 is defined as a lower gate oxide film 4. A gate electrode 5A is formed on the lower gate oxide film 4. The gate electrode 5A protrudes from the lower drain region 6 and the lower source region 7. An upper gate oxide film 4A is formed on the gate electrode 5A.

An upper drain region 6B is directly formed on the lower drain region 6. An upper source region 7B is directly formed on the lower source region 7. Accordingly, the lower drain region 6 is electrically connected to the upper drain region 6B, and the lower source region 7 is electrically connected to the upper source region 7B.

An epitaxial region 26 is formed on the upper gate oxide film 4A provided between the upper drain region 6B and the upper source region 7B. The surface of the epitaxial region 26 is formed on a level with the surfaces of the upper drain region 6B and upper source region 7B. The lower layer portion of the epitaxial region 26 is defined as a channel region 3A.

A field oxide film 2 for isolation between elements is formed on the sides of the lower drain region 6 and upper drain region 6B and those of the lower source region 7 and upper source region 7B. A layer insulating film 8 is formed to cover the upper drain region 6B, the upper source region 7B, the epitaxial region 26 and the field oxide film 2.

A contact hole 9 is provided on the layer insulating film 8 which is formed on the upper drain region 6B and the upper source region 7B. An aluminum wiring layer 23 is formed to fill the contact hole 9 on the upper drain region 6B, and an aluminum wiring layer 24 is formed to fill the contact hole 9 on the upper source region 7B. A passivation film 11 is formed on the overall surface.

Figure 21:
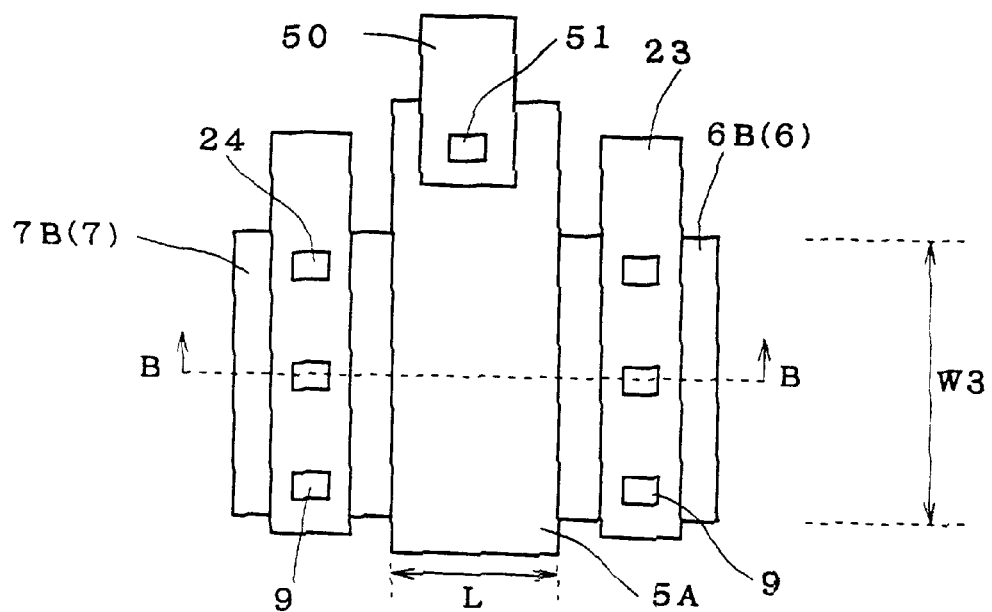
FIG. 21 is a plan view showing the planar structure of the semiconductor device according to the second embodiment.

FIG. 21 is a plan view showing the planar structure of the MOS device shown in FIG. 20. For convenience of explanation, the layer insulating film 8 and the passivation film 11 of FIG. 20 are not shown in FIG. 21. L designates a gate length, and W3 designates a gate width of the upper drain region 6B (lower drain region 6) and the upper source region 7B (lower source region 7). FIG. 20 shows a B—B section of FIG. 21.

As shown in FIGS. 20 and 21, the upper drain region 6B is formed so as to have the planar structure which corresponds to that of the lower drain region 6, and the upper source region 7B is formed so as to have the planar structure which corresponds to that of the lower source region 7.

The aluminum wiring layer 23 is formed to fill the contact hole 9 on the upper drain region 6B, and the aluminum wiring layer 24 is formed to fill the contact hole 9 on the upper source region 7B.

The MOS device having the above structure according to the second embodiment operates equivalently to a transistor comprised of a first partial transistor which includes the lower drain region 6, the lower source region 7, the lower gate oxide film 4 and the gate electrode 5A, and a second partial transistor which includes the upper drain region 6B, the upper source region 7B, the upper gate oxide film 4A and the gate electrode 5A.

Accordingly, the real gate width W of the MOS device according to the second embodiment is expressed by W=2·W3. The lower gate width W3 can be kept almost equal to the gate width W4 of the MOS device according to the prior art shown in FIGS. 25 and 26. The gate length L is the same as that of the structure according to the prior art. Consequently, the gate width W is greater, by the upper gate width W3, than that of the structure according to the prior art. Accordingly, the current flow between a source and a drain is increased so that the current driving ability is greatly enhanced.

The upper drain region 6B and the upper source region 7B are directly formed on the lower drain region 6 and the lower source region 7 respectively. Consequently, the upper gate width W3 does not cause the integration of the MOS device to be deteriorated.

Similarly to the first embodiment, the MOS device according to the second embodiment can show, with integration for first partial transistor formation, the current driving ability which is obtained by adding the current driving ability of the first partial transistor to that of the second partial transistor.

Accordingly, the MOS device according to the second embodiment has the great driving ability with high integration.

Figure 22:
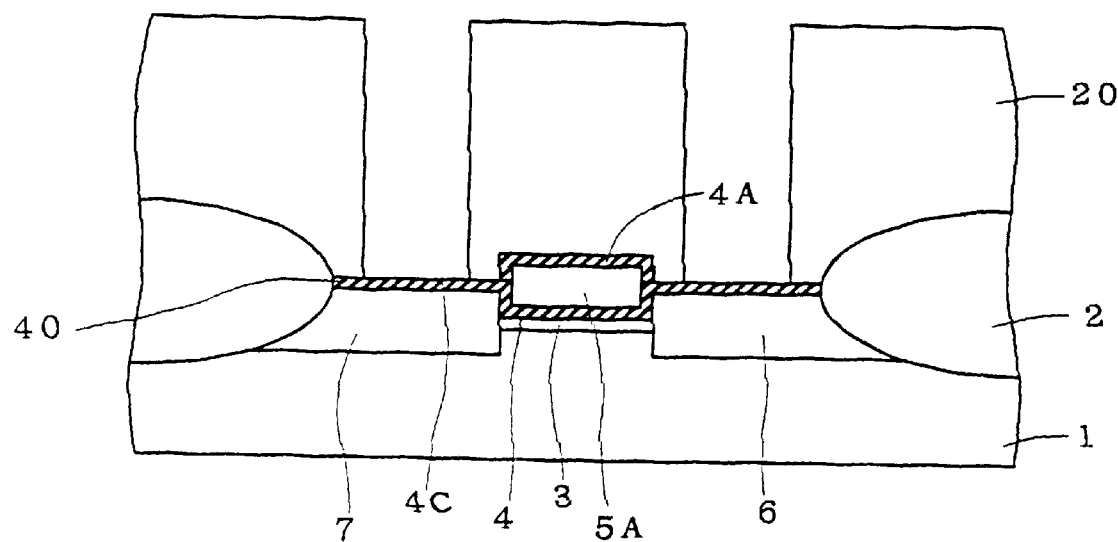
FIG. 22 is a sectional view showing a method for manufacturing the semiconductor device according to the second embodiment.
Figure 23:
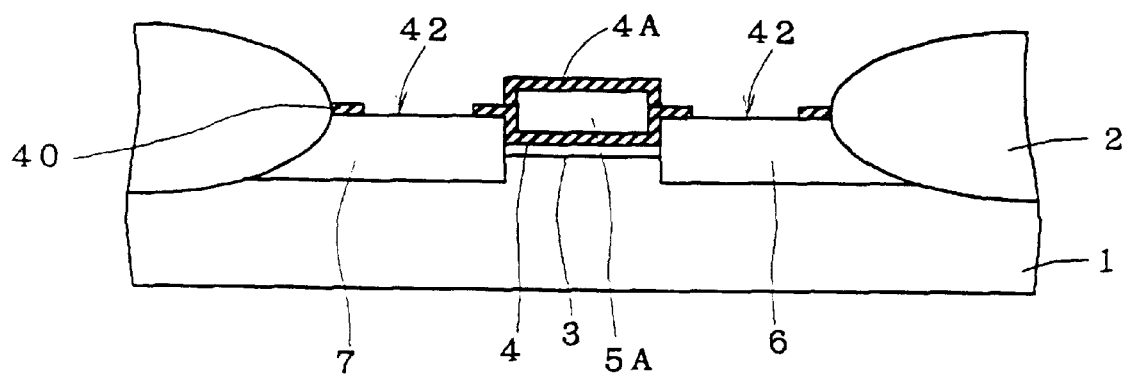
FIG. 23 is a sectional view showing the method for manufacturing the semiconductor device according to the second embodiment.
Figure 24:
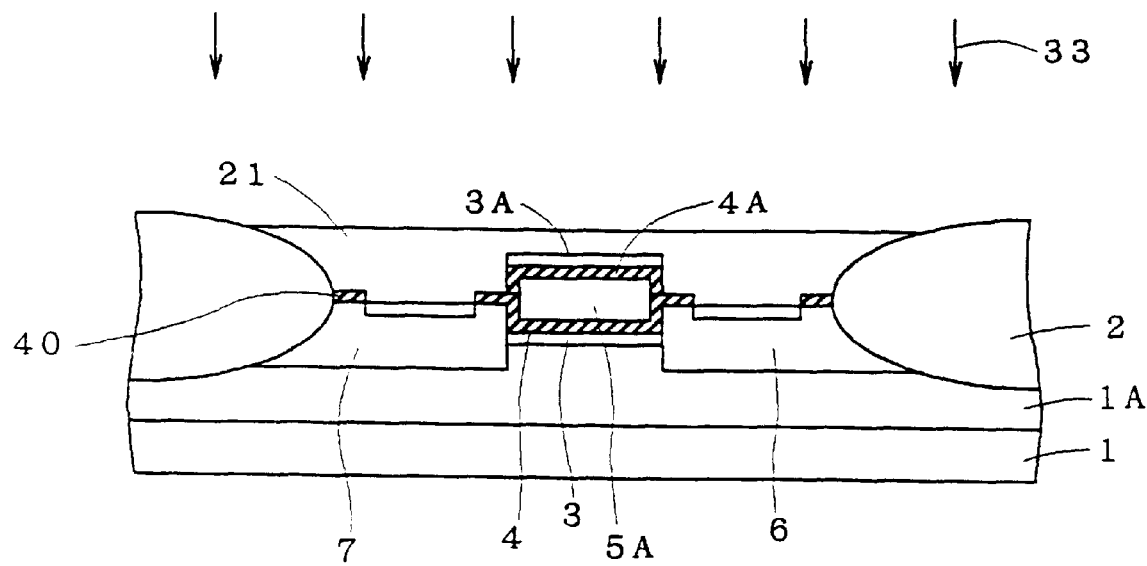
FIG. 24 is a sectional view showing the method for manufacturing the semiconductor device according to the second embodiment.

FIGS. 22 to 24 are sectional views showing a part of a method for manufacturing the MOS device according to the second embodiment. In the following description, known values are employed in ion implantation conditions, film forming diffusion conditions and the like which have no numeric values, and only the main part of the present invention has numeric values (wafer process parameter) in the same manner as in the first embodiment.

First of all, the same steps as those of the method for manufacturing the MOS device according to the first embodiment are executed so that a structure shown in FIG. 8 is obtained. As shown in FIG. 22, a photoresist pattern 20 for selectively removing the upper gate oxide film 4A is formed on the structure shown in FIG. 8. As shown in FIG. 23, a hole 42 is formed in such a manner that the surfaces of the lower drain region 6 and the lower source region 7 are partly exposed.

As shown in FIG. 24, an epitaxial film is formed at a thickness of about 1 $\mu$m by the epitaxial growth method with the crystal orientation of the lower drain region 6 and the lower source region 7, and smoothed by the etchback method so that an epitaxial layer 21 is formed at a thickness of about 0.5 $\mu$m. Then, P type impurity ions 33 are implanted in order of ~$10^{13}$/cm$^2$ at an energy of 50 KeV or less so that channel doping for adjusting a threshold voltage Vth is performed. Consequently, an upper channel region 3A is formed on the lower portion of the epitaxial layer 21 which is positioned on the upper gate oxide film 4A. Thereafter, the steps shown in FIGS. 11, 12, 14, 16 and 18 according to the first embodiment are executed so that the structure shown in FIG. 20 is obtained. The steps shown in FIGS. 13, 15, 17 and 19 are not executed.

According to the method for manufacturing the MOS device according to the second embodiment, the epitaxial layer 21 is formed by the epitaxial growth method with the crystal orientation of the lower drain region 6 and the lower source region 7. Then, the upper drain region 6B and the upper source region 7B are formed in the epitaxial layer 21.

Consequently, the epitaxial layer 21 can be formed with good crystalline properties so that the upper drain region 6B and the upper source region 7B have good crystalline properties. As a result, the performance of the second partial transistor can be enhanced. In the MOS device manufactured by the method according to the second embodiment, thus, the current driving ability can be enhanced and a current can be inhibited from leaking out.

While the MOS device having an NMOS transistor has been described in the first and the second embodiments, it is needless to say that a MOS device having a PMOS transistor can be implemented in just the same manner and an aluminum multilayer wiring can be used for the aluminum wiring layers 23 and 24, and the like.

While the invention has been described in detail, the foregoing description is in all aspects illustrative and not restrictive. It is understood that numerous other modifications and variations can be devised without departing from the scope of the invention.

I claim:

1. A method for manufacturing a semiconductor device comprising the steps of;

(a) preparing a semiconductor substrate of a first conductivity type, (b) forming a first insulating film on said semiconductor substrate, (c) forming a gate electrode on a predetermined gate electrode formation region on said first insulating film, said first insulating film positioned below said predetermined gate electrode formation region being defined as a first gate insulating film, and the surface of said semiconductor substrate positioned below said predetermined gate electrode formation region being defined as a first channel region, (d) selectively forming first and second semiconductor regions of a second conductivity type on the surface of said semiconductor substrate respectively, said first and second semiconductor regions being formed to hold said first channel region therebetween, said first semiconductor region having first and second partial semiconductor regions, and said second semiconductor region having third and fourth partial semiconductor regions, (e) forming a second gate insulating film on said gate electrode, (f) forming a semiconductor layer on said first insulating film and said second gate insulating film, the lower layer portion of said semiconductor layer positioned on said second gate insulating film being defined as a second channel region, (g) forming a third semiconductor region of the second conductivity type on said semiconductor layer adjacently to said second channel region above said first partial semiconductor region of said first semiconductor region, (h) forming a fourth semiconductor region of the second conductivity type on said semiconductor layer adjacently to said second channel region above said third partial semiconductor region of said second semiconductor region, (i) forming a first wiring layer from said second partial semiconductor region of said first semiconductor region to said third semiconductor region, and (j) forming a second wiring layer from said fourth partial semiconductor region of said second semiconductor region to said fourth semiconductor region.

2. The method for manufacturing a semiconductor device according to claim 1, wherein said step (b) comprises the steps of;

(b-1) providing a concave portion on the surface of said semiconductor substrate, and (b-2) forming said first insulating film on the surface of said semiconductor substrate which includes said concave portion, said predetermined gate electrode formation region being positioned above said concave portion of said semiconductor substrate.

3. The method for manufacturing a semiconductor device according to claim 2, wherein said step (i) comprises the steps of;

(i-1) forming a first insulating layer on the overall surface, (i-2) forming first and second contact holes on said first insulating layer positioned on said second partial semiconductor region of said first semiconductor region and said third semiconductor region respectively, and (i-3) forming said first wiring layer to fill said first and second contact holes, and wherein said step (j) comprises the steps of;

(j-1) forming a second insulating layer on the overall surface, (j-2) forming third and fourth contact holes on said second insulating layer positioned on said fourth partial semiconductor region of said second semiconductor region and said fourth semiconductor region respectively, and (j-3) forming said second wiring layer to fill said third and fourth contact holes.

4. The method for manufacturing a semiconductor device according to claim 3, wherein said step (f) comprises the step of implanting an impurity of the first conductivity type into the lower layer portion of said semiconductor layer positioned on said second gate insulating film to form said second channel region.

5. The method for manufacturing a semiconductor device according to claim 4, wherein said step (a) comprises the step of forming a first conductive well region on the upper layer portion of said semiconductor substrate.

6. A method for manufacturing a semiconductor device comprising the steps of;

(a) preparing a semiconductor substrate of a first conductivity type, (b) forming a first gate insulating film on said semiconductor substrate, the surface of said semiconductor substrate which is positioned under said gate insulating film being defined as a first channel region, (c) forming a gate electrode on said first gate insulating film, (d) selectively forming first and second semiconductor regions of a second conductivity type on the surface of said semiconductor substrate respectively, said first and second semiconductor regions being formed to hold said first channel region therebetween, (e) forming a second gate insulating film on said gate electrode, (f) forming a semiconductor layer on said first and second semiconductor regions and said second gate insulating film, said semiconductor layer being directly formed on at least a part of said first and second semiconductor regions, and the lower layer portion of said semiconductor layer which is positioned on said second gate insulating film being defined as a second channel region, (g) forming third and fourth semiconductor regions of the second conductivity type on the lower layer portion of said semiconductor layer which directly adjoins said first and second semiconductor regions respectively, said third and fourth semiconductor regions being formed to hold said second channel region therebetween, (h) forming a first wiring layer on said third semiconductor region, and (i) forming a second wiring layer on said fourth semiconductor region.

7. The method for manufacturing a semiconductor device according to claim 6, wherein said step (f) comprises the step of;

(f-1) forming said semiconductor layer by the epitaxial growth method with the crystal orientation of at least one of said first and second semiconductor regions.

8. The method for manufacturing a semiconductor device according to claim 7, wherein said step (f) further comprises, after said step (f-1), the step of;

(f-2) implanting an impurity of the first conductivity type into the lower layer portion of said semiconductor layer positioned on said second gate insulating film to form said second channel region.

* * * * *